(12) United States Patent
Kim

(10) Patent No.: US 7,745,925 B2
(45) Date of Patent: Jun. 29, 2010

(54) MULTI-FUNCTIONAL METAL SHIELD CASE AND METHOD FOR MAKING THE SAME

(75) Inventor: Sun-Ki Kim, Kyeonggi-do (KR)

(73) Assignee: Joinset Co., Ltd. (KR)

( * ) Notice: Subject to any disclaimer, the term of this patent is extended or adjusted under 35 U.S.C. 154(b) by 419 days.

(21) Appl. No.: 11/438,039

(22) Filed: May 19, 2006

(65) Prior Publication Data
US 2006/0220238 A1 Oct. 5, 2006

Related U.S. Application Data

(63) Continuation of application No. PCT/KR2004/002792, filed on Nov. 2, 2004.

(30) Foreign Application Priority Data
Nov. 19, 2003 (KR) .................. 10-2003-0082380

(51) Int. Cl.
*H01L 23/12* (2006.01)

(52) U.S. Cl. .................. 257/704; 257/659; 257/660; 257/728; 257/729; 257/731; 257/E23.104

(58) Field of Classification Search ............. 257/728, 257/729, 659, 660, E23.104, 704, 731
See application file for complete search history.

(56) References Cited

U.S. PATENT DOCUMENTS 5,148,172 A * 9/1992 Kumurdjian ............... 342/1

| | | | | |
|---|---|---|---|---|
| 5,166,772 A | * | 11/1992 | Soldner et al. | 257/659 |
| 6,452,265 B1 | * | 9/2002 | Furukawa et al. | 257/723 |
| 2003/0020158 A1 | * | 1/2003 | Miura et al. | 257/704 |
| 2005/0006119 A1 | * | 1/2005 | Cunningham et al. | 174/35 R |

FOREIGN PATENT DOCUMENTS

| JP | 64-28998 | 1/1989 |
|---|---|---|
| JP | 4-120759 | 4/1992 |

OTHER PUBLICATIONS

International Search Report, Feb. 18, 2005, 1 Page.

* cited by examiner

*Primary Examiner*—Eugene Lee
*Assistant Examiner*—Peniel M Gumedzoe
(74) *Attorney, Agent, or Firm*—Park & Associates IP Law LLC

(57) ABSTRACT

A multi-functional metal shield case and a method for making the same are provided. The multi-functional metal shield case includes a metal main body and an electrically non-conductive and heat conductive silicon layer. The metal main body includes a base and sidewalls integrally bent along edges of the base, and the electrically non-conductive and heat conductive silicon layer is formed on inner sides of the base and the sidewalls. Accordingly, heat can be rapidly transferred to the metal main body and emitted to an outside. Since the heat conductive silicon layer is non-conductive, an electric shock does not occur between the electronic component and the metal shield case. Further, since the heat conductive silicon layer is in contact with the electronic component, heat can be transferred more rapidly.

22 Claims, 4 Drawing Sheets

MULTI-FUNCTIONAL METAL SHIELD CASE AND METHOD FOR MAKING THE SAME

CROSS-REFERENCE TO RELATED APPLICATIONS

The present application is a continuation of pending International patent application PCT/KR2004/002792 filed on Nov. 2, 2004 which designates the United States and claims priority of Korean patent Application No. 10-2003-0082380 filed on Nov. 19, 2003.

FIELD OF THE INVENTION

The present invention relates to a multi-functional metal shield case and a method for making the same. More particularly, the present invention relates to a multi-functional metal shield case, in which a heat conductive silicon layer having an electrically non-conductive property is formed on an inner side of a metal main body, such that heat generated from electronic components or electronic component modules can be rapidly transferred to the metal main body to thereby emit the heat to an outside.

In addition, the present invention relates to a multi-functional metal case, in which a heat conductive silicon layer having an electrically non-conductive property and an electromagnetic absorbing silicon layer having an electrically semiconductive property and a heat conductive property are sequentially formed on an inner side of a metal main body, such that heat generated from electronic components or electronic component modules can be rapidly transferred to an outside and an electromagnetic wave transferred/emitted from/to an outside can be absorbed.

Further, the present invention relates to a method for making the multi-functional metal shield case.

BACKGROUND OF THE INVENTION

As an electronic device and an information communication device are down-scaled and integrated more highly, they are greatly affected by heat, static electricity and electromagnetic wave. For example, a microprocessor that is one of electronic components processes data at higher speed and a storage capacity of a semiconductor memory increases larger, it generates a large amount of heat and electromagnetic wave, such that it is greatly affected by heat, static electricity and electromagnetic wave.

According to the prior art, a metal shield case is used to shield an electromagnetic wave generated from an electronic component or an electronic component module mounted on a printed circuit board (PCB). In the manufacturing process of the metal shield case, a metal shield case is made by continuously pressing a metal sheet and is soldered on a PCB where electronic components or electronic component modules are mounted. In this manner, an electromagnetic wave is shielded.

When such a metal shield case is used, heat is generated from the electronic components or the electronic component modules. To solve this problem, a vent hole is formed in a predetermined portion of the shield case. That is, air inside the metal shield case is circulated by convection or is forcibly circulated by a fan through the vent hole, thereby emitting the heat to an outside.

However, if a large number of vent holes are formed in consideration of the heat emission, it is difficult to shield an electromagnetic wave. Meanwhile, if a small number of vent holes are formed, it is difficult to circulate an air. Accordingly, an optimum number of vent holes must be formed so as to rapidly transfer the heat to the outside and effectively shield the electromagnetic wave.

Meanwhile, the electronic components or the electronic component modules received in the metal shield case must be electrically insulated from the metal shield case. Therefore, the metal shield case must be made in a sufficient size.

However, if the metal shield case is made in a large size, a wide gap exists between the metal shield case and the electronic component, and an air space therein causes the heat conductivity to decrease. Also, due to the air space, there is a limit in protecting the electronic component from an external impact. Further, it is reverse to the down-scale and the high integration and a manufacturing cost also increases.

Regarding the electric insulation, a method for attaching an insulated tape to an inner side of a metal shield case has been proposed. However, this method has following problems. Since a heat conductivity of the insulated tape is low and an elastic force of the insulated tape is low, the electronic component cannot be protected from an external impact. Also, due to the additional process, a manufacturing cost may increase and the vent hole may be closed due to the insulated tape.

SUMMARY OF THE INVENTION

It is an object of the present invention to provide a multi-functional metal shield case and a method for making the same, in which heat generated from an electronic component or an electronic component module can be rapidly transferred to a metal main body and an electronic component can be protected from an external impact. Also, the multi-functional metal shield case can be down-scaled and integrated more highly.

It is another object of the present invention to provide a multi-functional metal shield case and a method for making the same, in which heat generated from an electronic component or an electronic component module can be rapidly transferred to an outside and an electromagnetic wave transferred/emitted from/to an inside can be shielded.

DETAILED DESCRIPTION OF THE INVENTION

Figure 1:
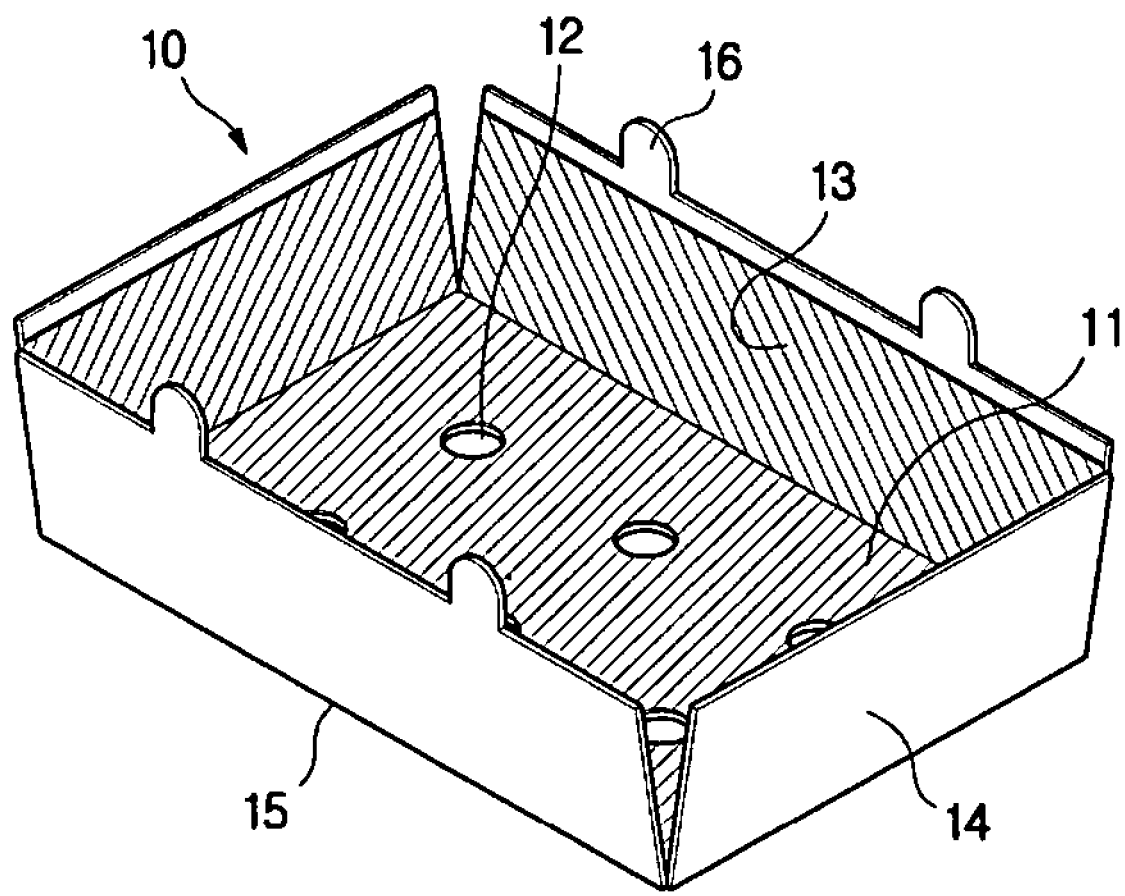
FIG. 1 is a perspective view of a metal shield case according to an embodiment of the present invention.

According to an aspect of the present invention, a multi-functional metal shield case comprises: a metal main body including a base and sidewalls, the sidewalls being integrally bent along edges of the base; and an electrically non-conductive and heat conductive silicon layer formed on inner sides of the base and the sidewalls.

According to another aspect of the present invention, a multi-functional metal shield case comprises: a metal main body including a base and sidewalls, the sidewalls being integrally bent along edges of the base; an electromagnetic absorbing silicon layer formed on inner sides of the base and the sidewalls, the electromagnetic absorbing silicon layer having an electrically semiconductive property and a heat conductive properties; and an electrically non-conductive and heat conductive silicon layer formed on the electromagnetic absorbing silicon layer.

The multi-functional metal shield case further comprises at least one vent hole, which is formed through the metal main body and the heat conductive silicon layer, or through the metal main body, the heat conductive silicon layer and the electromagnetic absorbing silicon layer.

Preferably, the heat conductive silicon layer having the electrically non-conductive property or the electromagnetic absorbing silicon layer having the electrically semiconductive and heat conductive property can be formed on only the base of the metal main body.

The multi-functional metal shield case further comprises tips integrally protruded at ends of the sidewalls such that the tips are inserted and fixed to a PCB, and the heat conductive silicon layer or the heat conductive silicon layer and the electromagnetic absorbing silicon layer are formed at regions except the tips.

The heat conductive silicon layer may be directly in contact with an electronic component or an electronic component module, which is received in the metal shield case.

According to a further another aspect of the present invention, a method for making a multi-functional metal shield case comprises the steps of: preparing a metal main body developed on a plane, the metal main body including a base and sidewalls integrally formed along edges of the base; forming an electrically non-conductive and heat conductive silicon layer on an inner side of the metal main body; and bending the sidewalls of the metal main body to thereby form a reception space.

According to a still further another aspect of the present invention, a method for making a multi-functional metal shield case comprises the steps of: preparing a metal main body developed on a plane, the metal main body including a base and sidewalls integrally formed along edges of the base; forming an electromagnetic absorbing silicon layer on an inner side of the metal main body, the electromagnetic absorbing silicon having an electrically semiconductive property and a heat conductive property; forming an electrically non-conductive and heat conductive silicon layer on the electromagnetic absorbing silicon layer; and bending the sidewalls of the metal main body to thereby form a reception space.

The heat conductive silicon layer may be formed by coating a liquid-state electrically conductive silicon and performing a thermosetting process thereon.

The electromagnetic absorbing silicon layer may be formed by coating a liquid-state electromagnetic absorbing silicon and performing a thermosetting process thereon.

According to the present invention, an electrically non-conductive silicon layer is coated on an inner side of a metal main body, such that heat generated from an electronic component or an electronic component module can be rapidly transferred to a metal main body, thereby emitting the heat to an outside.

Also, an electromagnetic absorbing silicon layer having an electrically semiconductive property and a heat conductive property and a heat conductive silicon layer having an electrically non-conductive property are sequentially formed on an inner side of the metal main body, such that heat generated from an electronic component and an electronic component module can be rapidly transferred to the metal main body and an electromagnetic wave transferred/emitted from/to an outside can be shielded.

In addition, since it need not be careful about a contact with an electronic component, an entire size of a shield case can be reduced, resulting in a down-scale and a high integration thereof.

Further, since a vent hole is formed by a press/bending process after a heat conductive silicon layer is coated, a necessary number of vent holes can be formed at the same position of the heat conductive silicon layer and the metal main body.

Hereinafter, the embodiments of the present invention will be described in detail with reference to the accompanying drawings.

Figure 2:
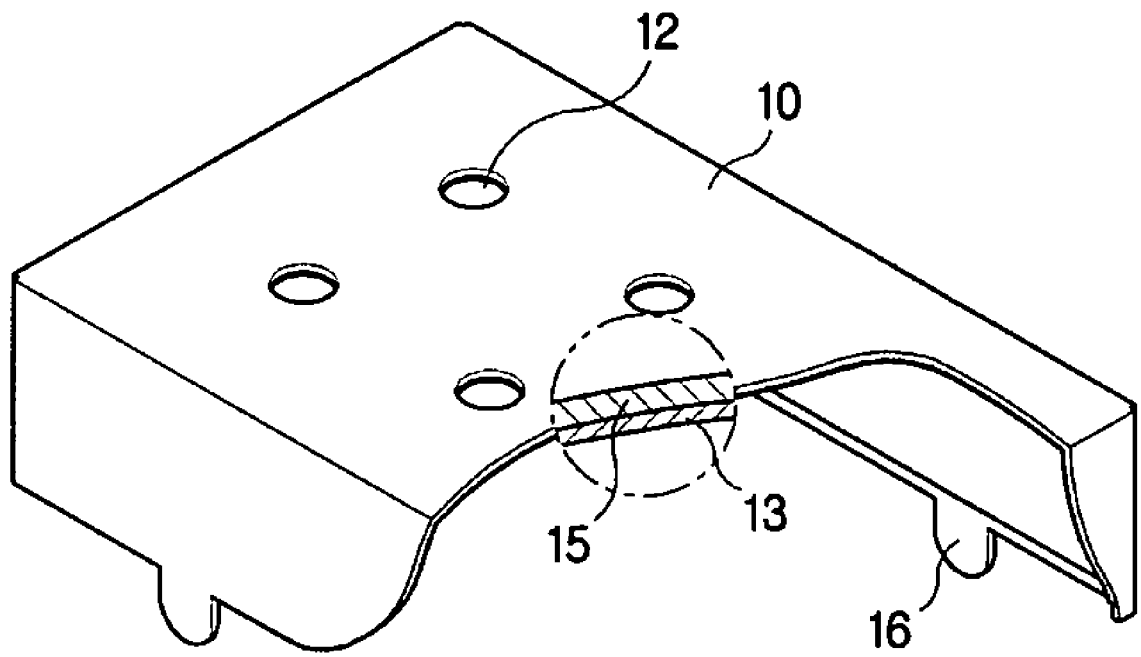
FIG. 2 is a cut-away perspective of the metal shield case shown in FIG. 1.

FIG. 1 is a perspective view of a metal shield case according to an embodiment of the present invention, and FIG. 2 is a cut-away perspective of the metal shield case shown in FIG. 1.

Referring to FIGS. 1 and 2, a metal shield case 10 according to an embodiment of the present invention includes a metal main body 15 and a heat conductive silicon layer 13 having an electrically non-conductive property. The metal main body 15 includes a base 11 and sidewalls 14, which are integrally bent along edges of the base 11. The heat conductive silicon layer 13 is formed on inner sides of the base 11 and the sidewalls 14.

The base 11 and the sidewalls 14 can be integrally formed to define a closed reception space or can be formed by designing the sidewalls 14 around the base 11 on a plane and bending the sidewalls 14. Although both of the methods can be applied, the latter is more efficient because the mass production is possible while the heat conductive silicon layer 13 is formed on the inner sides.

In the case of the latter, the edges may not be attached while maintaining a constant interval in such a state that the sidewalls 14 are bent.

Preferably, a plurality of vent holes 12 can be formed at the entire metal main body 15 or a portion of the metal main body 15, for example, the base 11.

The metal main body 15 is formed in size so that a gap between the metal main body 15 and the electronic component or the electronic component module can be minimized, preferably so that the metal main body 15 can be directly in contact with the electronic component.

Tips 16 are formed at ends of the sidewalls 14 opposite to each other and are soldered with a PCB. The heat conductive silicon layer 13 is not formed on the ends of the sidewalls 14 including the tips 16, so that the soldering cannot be affected when the tips are mounted on the PCB, as will be described later.

The heat conductive silicon layer 13 is formed by uniformly mixing an electrically non-conductive and heat conductive ceramic powder with an electrically non-conductive silicon. Preferably, boron nitride or aluminum oxide can be used as the electrically non-conductive and heat conductive ceramic powder. That is, the boron nitride or the aluminum oxide can transfer the heat well but have an electrically insulating property.

The heat conductive silicon layer 13 can be formed by uniformly mixing a liquid and electrically non-conductive silicon with an electrically non-conductive and heat conductive ceramic powder, such as boron nitride or aluminum oxide.

Predetermined portions of the base 11 and the sidewalls 14 of the metal main body 15 developed on a plane are coated using a caster, a laminator or an extruder, and then a metal shield case is made by a thermosetting process and a press/bending process.

If necessary, the heat conductive silicon layer 13 can be coated on the base 11 alone of the metal main body 15 developed on a plane.

Preferably, in order to firmly attach the heat conductive silicon layer 13 to the metal main body, a primer process may be performed on the metal main body 15 before the coating process.

Also, an appropriate number of vent holes 12 can be formed during the press/bending process.

By coating the heat conductive silicon layer 13, heat generated from the electronic component or the electronic component module can be rapidly transferred to the metal main body. Also, since the heat conductive silicon layer 13 is non-conductive, an electric shock does not occur between the electronic component and the metal shield case.

Specifically, since the heat conductive silicon layer 13 is directly in contact with the electronic component, the heat can be rapidly transferred two or more times. In addition, the metal shield case can be down-scaled and integrated more highly because its entire size is reduced.

Further, since the vent holes are formed after the heat conductive silicon layer is formed, a necessary number of the vent holes can be formed at the same positions of the heat conductive silicon layer and the metal main body.

Furthermore, since the heat conductive silicon layer 13 has an elasticity with respect to an external physical impact, such as a bending of the PCB, the impact can be absorbed.

Meanwhile, when the formation of the metal shield case by using the above-described continuous processes is inefficient because the size of the metal shield case is small or the heat conductive silicon layer is very thick, for example, 2 mm or more, the metal shield case is made by pressing and bending the metal main body alone, and then a heat conductive silicon sheet is properly cut and processed. Thereafter, the heat conductive silicon sheet is attached using a heat conductive silicon tape or a liquid heat conductive silicon. In this manner, the heat conductive silicon layer can be coated on the metal shield case.

In this case, the same zig can be applied so as to match the vent hole of the metal shield case with the vent holes of the heat conductive silicon sheet.

Figure 3:
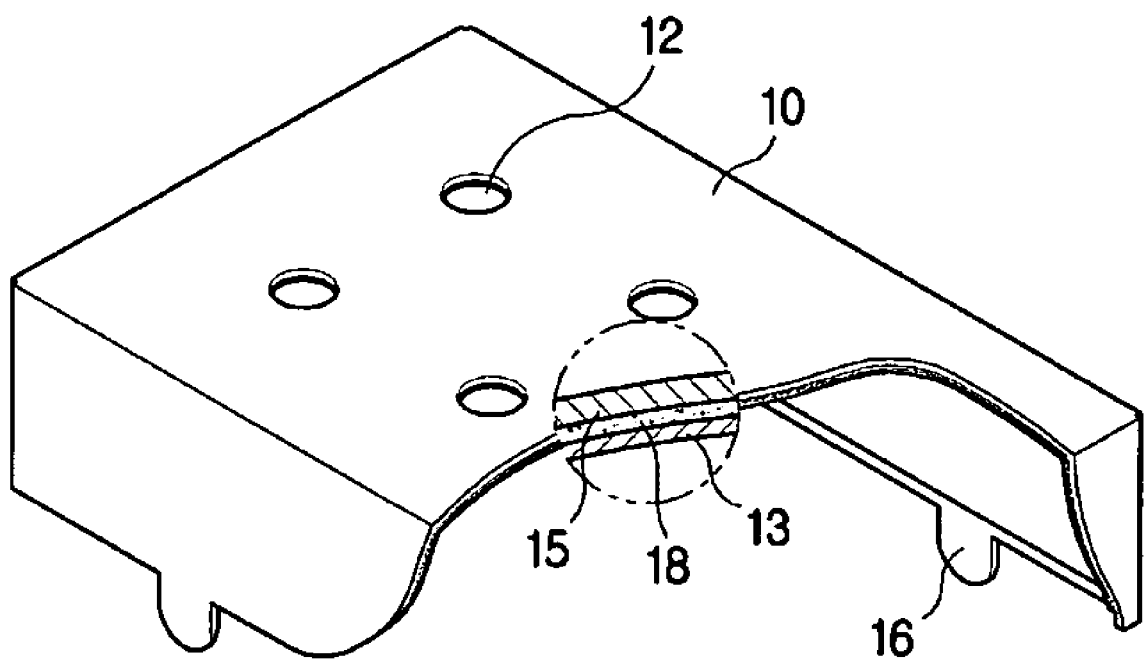
FIG. 3 is a cut-away perspective view of a modification of the metal shield case shown in FIG. 2.

FIG. 3 is a cut-away perspective view of a modification of the metal shield case shown in FIG. 2.

Referring to FIG. 3, an electromagnetic absorbing silicon layer 18 having an electrically semiconductive property and a heat conductive property is coated on an inner side of a metal main body 15. Then, an electrically non-conductive and heat conductive silicon layer 13 is formed on the electromagnetic absorbing silicon layer 18.

The electromagnetic absorbing silicon layer 18 is formed by uniformly mixing an electromagnetic absorbing powder having an electrically conductive property and a heat conductive property with an electrically non-conductive silicon.

Preferably, the electromagnetic absorbing powder is one selected from the group consisting of a soft magnetic metal, a carbon graphite, Ni—Zn ferrite, Cu—Zn ferrite, Mg—Zn ferrite and Ba ferrite, which are a soft magnetic material having a spinel crystal structure. Among them, the ferrite is a sintered ferrite.

The soft magnetic metal and the ferrites have both the electromagnetic absorbing property and the electromagnetic shielding property. Also, when the soft magnetic metal and the ferrites are mixed with the electrically non-conductive silicon, their electric resistance increases and thus they have an electrically semiconductive property. Therefore, they can also remove a static electricity.

Using a mixer, a liquid-state electrically non-conductive silicon is uniformly mixed with a soft magnetic metal, a carbon or a soft magnetic ferrite, which has an electromagnetic absorbing property. Then, the liquid-state electromagnetic absorbing silicon layer 18 is coated on a necessary portion of the metal main body 15 by using a caster, a laminator or an extruder, and then a thermosetting process is performed.

Then, as described above, the electrically non-conductive and heat conductive ceramic powder, such as a boron nitride and an aluminum oxide, is uniformly mixed with the liquid-state electrically non-conductive silicon, and then the heat conductive silicon layer 13 is formed on the thermosetting electromagnetic absorbing silicon layer 18 by using a caster, a laminator or an extruder, and then a thermosetting process is performed.

After a pressing and bending process, the vent holes 12 are formed at the predetermined positions.

In this embodiment, since the heat conductive silicon layer 13 is coated, heat generated from the electronic component or the electronic component module can be rapidly transferred to the metal main body. Also, since the heat conductive silicon layer 13 is non-conductive, an electric shock does not occur between the electronic component and the metal shield case.

Also, a heat transfer rate of the electromagnetic absorbing silicon layer is more than 3 W/m° C. Therefore, compared with a case where only a heat conductive silicon layer having a heat transfer rate of less than 3 W/m° C. is applied, the present invention can transfer the heat more rapidly under the condition of the same thickness.

In addition to the improvement of the heat transfer efficiency, the electromagnetic wave or the static electricity generated from the electronic component can be absorbed and shielded.

Further, the electromagnetic wave generated from the electronic component is absorbed by the electromagnetic absorbing silicon layer and is lost as heat. The electromagnetic wave passing through the electromagnetic absorbing silicon layer is partially reflected from the metal main body and again collides with the electromagnetic absorbing silicon layer. Consequently, the electromagnetic wave is again absorbed.

Figure 4:
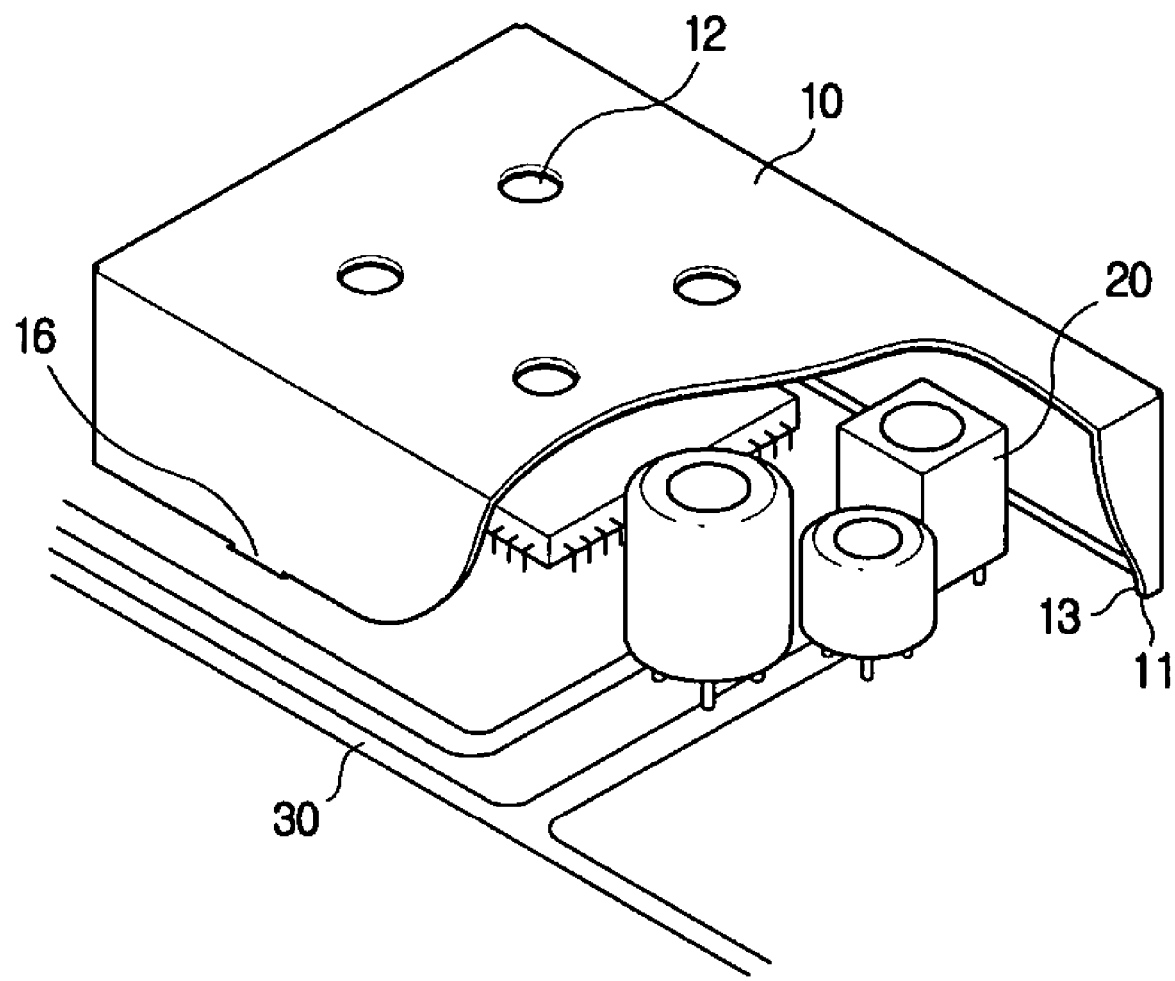
FIG. 4 is a cut-away perspective view of the metal shield case that is actually applied according to an embodiment of the present invention.

FIG. 4 is a cut-away perspective view of the metal shield case that is actually applied according to an embodiment of the present invention.

Referring to FIG. 4, the electronic components 20 are mounted on the PCB where line patterns 30 are formed, and the metal shield case 10 is mounted on the PCB by tips 16, such that the electronic components 20 are received therein.

Since the tips 16 are not coated with the heat conductive silicon layer 13, they do not affect the soldering. Also, heat generated from the electronic components is rapidly transferred through the heat conductive silicon layer 13 to the metal shield case 10 and then is emitted to an outside.

While the present invention has been described in detail, it should be understood that various changes, substitutions and alternations can be made hereto without departing from the spirit and scope of the invention as defined by the appended claims.

What is claimed is:

1. A metal shield case for receiving and shielding an electronic device, comprising:

a metal main body including a base and sidewalls formed with a metal plate, the sidewalls bent along edges of the base; and an electrically non-conductive and thermally conductive silicon layer disposed only on inner sides of the base and the sidewalls and to a predetermined thickness of generally uniform dimension while having a material receiving space in an inner area of the metal shield case for retaining an electronic device in the material receiving space such that heat in the electronic device received in the metal shield case can be readily transferred to the metal main body through the electrically non-conductive and thermally conductive silicon layer for emitting to outside.

2. The metal shield case of claim 1, further comprising at least one vent hole formed through the metal main body and the electrically non-conductive and thermally conductive silicon layer.

3. The metal shield case of claim 1, further comprising tips integrally protruding at ends of the sidewalls such that the tips can be inserted and fixed to a PCB, wherein the electrically non-conductive and thermally conductive silicon layer is disposed at regions except at or around the tips.

4. The metal shield case of claim 1, wherein the electrically non-conductive and thermally conductive silicon layer is directly in contact with the electronic device received in the metal shield case.

5. A metal shield case for receiving and shielding an electronic device, comprising:
  a metal main body including a base and sidewalls formed with a metal plate, the sidewalls bent along edges of the base;
  an electromagnetic absorbing silicon layer disposed only on inner sides of the base and the sidewalls, the electromagnetic absorbing silicon layer having an electrically semiconductive property and a thermally conductive property; and
  an electrically non-conductive and thermally conductive silicon layer disposed on the electromagnetic absorbing silicon layer and to a predetermined thickness of generally uniform dimension while having a material receiving space in an inner area of the metal shield case for retaining an electronic device in the material receiving space such that heat in the electronic device received in the metal shield case can be readily transferred to the metal main body through the electrically non-conductive and thermally conductive silicon layer and the electromagnetic absorbing silicon layer for emitting to outside.

6. The metal shield case of claim 5, further comprising at least one vent hole formed through the metal main body, the electrically non-conductive and thermally conductive silicon layer, and the electromagnetic absorbing silicon layer.

7. The metal shield case of claim 5, further comprising tips integrally protruding at ends of the sidewalls such that the tips can be inserted and fixed to a PCB, wherein the electrically non-conductive and thermally conductive silicon layer and the electromagnetic absorbing silicon layer are disposed at regions except at or around the tips.

8. The metal shield case of claim 5, wherein the electrically non-conductive and thermally conductive silicon layer is directly in contact with the electronic device received in the metal shield case.

9. A metal shield case for receiving and shielding an electronic device, comprising:
  a metal main body including a base and sidewalls formed with a metal plate, the sidewalls bent along edges of the base; and
  an electrically non-conductive and thermally conductive silicon layer disposed only on inner sides of the base and to a predetermined thickness while having a material receiving space in an inner area of the metal shield case for retaining an electronic device in the material receiving space such that heat in the electronic device received in the metal shield case can be readily transferred to the metal main body through the electrically non-conductive and thermally conductive silicon layer for emitting to outside.

10. The metal shield case of claim 9, further comprising at least one vent hole formed through the base and the electrically non-conductive and thermally conductive silicon layer.

11. The metal shield case of claim 9, further comprising tips integrally protruding at ends of the sidewalls such that the tips can be inserted and fixed to a PCB, wherein the electrically non-conductive and thermally conductive silicon layer is disposed at regions except at or around the tips.

12. The metal shield case of claim 9, wherein the electrically non-conductive and thermally conductive silicon layer is directly in contact with the electronic device received in the metal shield case.

13. A metal shield case for receiving and shielding an electronic device, comprising:
  a metal main body including a base and sidewalls formed with a metal plate, the sidewalls bent along edges of the base;
  an electromagnetic absorbing silicon layer disposed only on inner sides of the base, the electromagnetic absorbing silicon layer having an electrically semiconductive property and a thermally conductive property; and
  an electrically non-conductive and thermally conductive silicon layer disposed on the electromagnetic absorbing silicon layer and to a predetermined thickness while having a material receiving space in an inner area of the metal shield case for retaining an electronic device in the material receiving space such that heat in the electronic device received in the metal shield case can be readily transferred to the metal main body through the electrically non-conductive and thermally conductive silicon layer and the electromagnetic absorbing silicon layer for emitting to outside.

14. The metal shield case of claim 13, further comprising at least one vent hole formed through the base, the electrically non-conductive and thermally conductive silicon layer, and the electromagnetic absorbing silicon layer.

15. The metal shield case of claim 1, wherein the electrically non-conductive and thermally conductive silicon layer is formed of a material composed with electrically non-conductive silicon mixed with electrically non-conductive and thermally conductive ceramic powder.

16. The metal shield case of claim 15, wherein the electrically non-conductive and thermally conductive ceramic powder is boron nitride or aluminum oxide.

17. The metal shield case of claim 5, wherein the electrically non-conductive and thermally conductive silicon layer is formed of a material composed with electrically non-conductive silicon mixed with electrically non-conductive and thermally conductive ceramic powder.

18. The metal shield case of claim 17, wherein the electrically non-conductive and thermally conductive ceramic powder is boron nitride or aluminum oxide.

19. The metal shield case of claim 5, wherein the electromagnetic absorbing silicon layer is formed of a material composed with electrically non-conductive silicon mixed with electromagnetic absorbing powder.

20. The metal shield case of claim 9, wherein the electrically non-conductive and thermally conductive silicon layer is formed of a material composed with electrically non-conductive silicon mixed with electrically non-conductive and thermally conductive ceramic powder.

21. The metal shield case of claim 13, wherein the electrically non-conductive and thermally conductive silicon layer is formed of a material composed with electrically non-conductive silicon mixed with electrically non-conductive and thermally conductive ceramic powder.

22. The metal shield case of claim 13, wherein the electromagnetic absorbing silicon layer is formed of a material composed with electrically non-conductive silicon mixed with electromagnetic absorbing powder.

* * * * *